Figure 1:
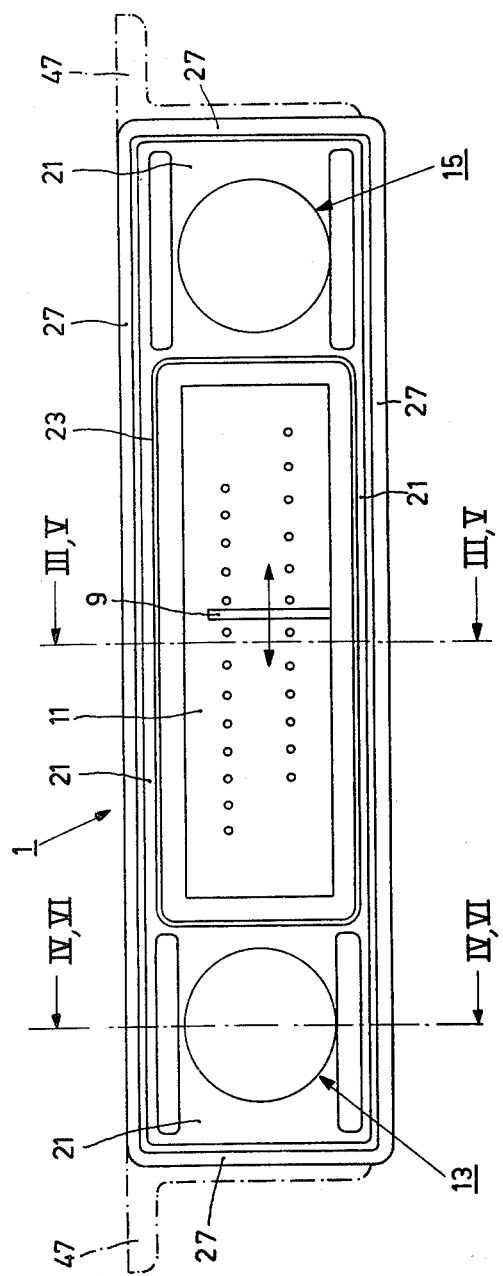

United States Patent [19]

Bentlage et al.

[11] 4,270,225
[45] May 26, 1981

[54] ELECTRICAL APPARATUS COMPRISING A REVERSIBLE FRONT PLATE

[75] Inventors: Bernardus W. J. Bentlage; Geert Spakman, both of Eindhoven, Netherlands

[73] Assignee: U.S. Philips Corporation, New York, N.Y.

[21] Appl. No.: 36,275

[22] Filed: May 4, 1979

[30] Foreign Application Priority Data

May 26, 1978 [NL] Netherlands .......................... 7805727

[51] Int. Cl.$^3$ ............................................... H04B 1/08
[52] U.S. Cl. .................................... 455/347; 455/351; 455/128; 455/90
[58] Field of Search .................... 325/312, 15, 16, 111, 325/112, 117, 119, 352, 353, 355, 361; 312/7 R, 242, 245; D10/12, 40; D14/14, 17, 18; D12/192; 455/345, 344, 347, 348, 349, 351, 128, 99, 95, 90, 89

[56] References Cited

U.S. PATENT DOCUMENTS

| 3,906,371 | 9/1975 | Tsuji | 325/352 |
| 3,922,047 | 11/1975 | Tsuji | 312/7 R |
| 3,960,349 | 6/1976 | Schierholz et al. | 312/242 |
| 4,068,175 | 1/1978 | Maniaci | 325/352 |
| 4,211,976 | 7/1980 | Inolie | 455/345 |

FOREIGN PATENT DOCUMENTS

| 7406827 | 4/1975 | Fed. Rep. of Germany | 325/312 |
| 961569 | 11/1949 | France | 312/7 R |
| 508555 | 1/1955 | Italy | 325/312 |

Primary Examiner—Benedict V. Safourek
Assistant Examiner—Tommy P. Chin
Attorney, Agent, or Firm—Thomas A. Briody; William J. Streeter; Rolf E. Schneider

[57] ABSTRACT

An electrical apparatus is provided with a cabinet which accommodates an electrical device having a control member and a box-shaped member both projecting beyond the circumference of the cabinet. The open control side of the apparatus is closed by means of a reversible front plate which fits over the control member and the box-shaped member. The front plate has a peripheral endless upright wall which renders the apparatus suitable for building into a wall or, upon inverting of the front plate, for mounting against a wall.

1 Claim, 6 Drawing Figures

ELECTRICAL APPARATUS COMPRISING A REVERSIBLE FRONT PLATE

This invention relates to an electrical apparatus, comprising a mainly rectangular cabinet which is open on one side, an electrical device accommodated in the cabinet and having a number of control members project beyond the circumference of the cabinet and are accessible from said one side which is closed by a cover plate, and a front plate having an opening for the passage of a control member of the electrical device.

In a known apparatus of the described kind (German Gebrauchsmuster No. 7406827), the cabinet has a weakened portion along which part of the cabinet can be broken off. The depth of the cabinet can thus be reduced over a distance which equals the length of a projecting part of the front plate in which the scale plate is accommodated. The overall depth of the apparatus thus remains independent of the manner in which the front plate is mounted on the cabinet. In other words, this front plate can be mounted so that the said projecting part faces the cabinet or is remote from the cabinet. A reversible or invertible front plate of this kind is used for apparatus which must be suitable for building into a wall, such as for example car radios. For apparatus to be built in, only a given building-in depth is available in many cases. On the other hand, for mounting on or against a wall, the side of the apparatus must be closed. In the known apparatus, this purpose is served by the part of the cabinet which can be broken off along the weakened portion.

The described known apparatus has the drawback in that, in the case of mounting on or against a wall, part of the cabinet must be broken off. This is not only time consuming, but also constitutes a waste of cabinet material.

The present invention has for its object to provide an electrical apparatus which is suitable for building in as well as for mounting on or against a wall, the cabinet as well as the front plate being identical in both cases.

To this end, an electrical apparatus in accordance with the invention is characterized in that the cover plate is situated in a mainly rectangular, box-shaped member which forms part of the electrical device and which projects beyond the circumference of the cabinet, the front plate being provided with a window whose dimensions substantially correspond to the dimensions of the box-shaped member, said front plate furthermore having interconnecting upright walls which extend transversely of the plane of the front plate and whose height is less than the distance over which the box-shaped member projects beyond the circumference of the cabinet, said walls forming an edge whose circumferential dimensions correspond to the circumferential dimensions of the cabinet.

A special embodiment of an electrical apparatus in accordance with the invention is furthermore characterized in that the upright walls of the front plate connect with the circumference of the cabinet in which the electrical device is accommodated.

Figure 2:
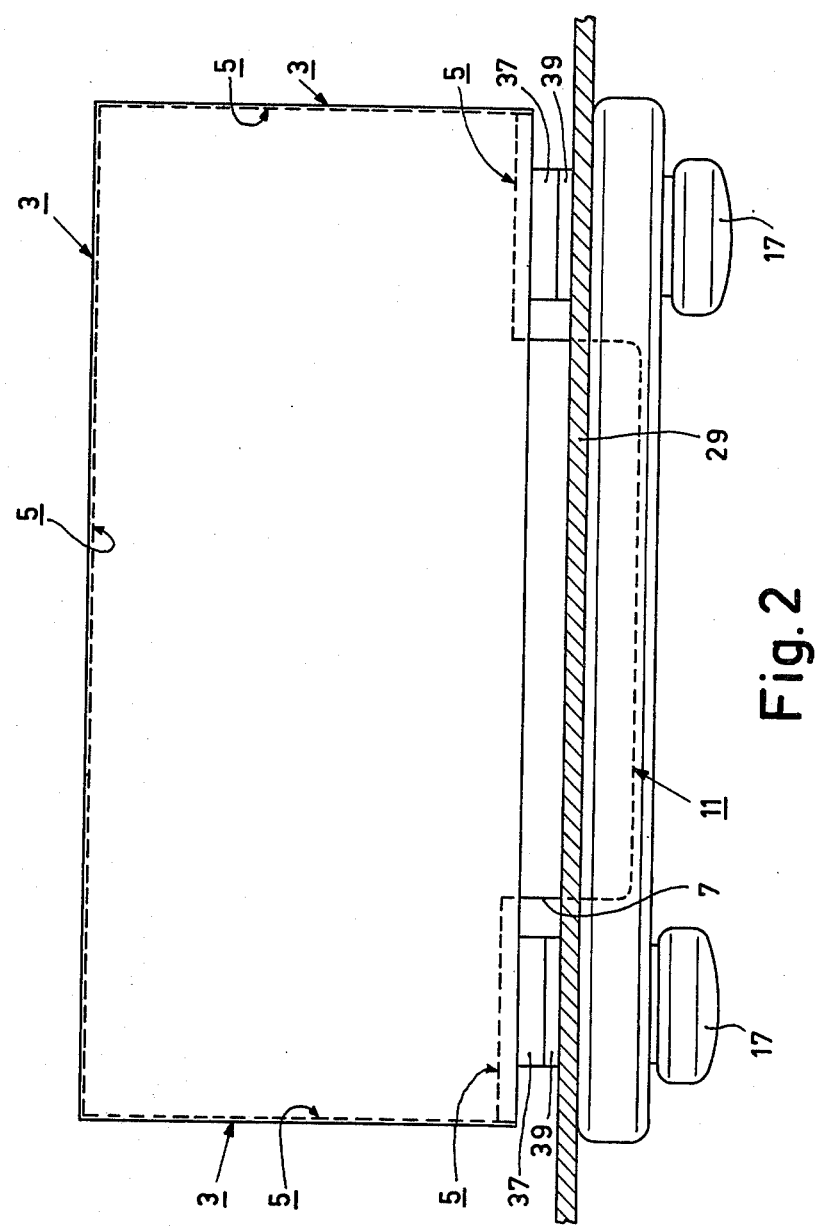
Figure 3:
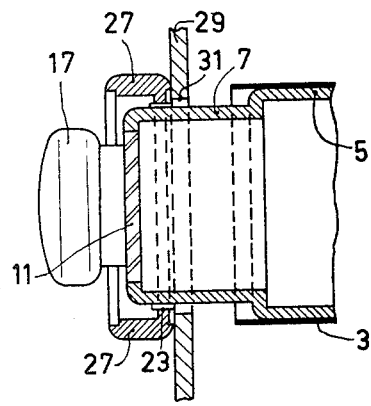
Figure 4:
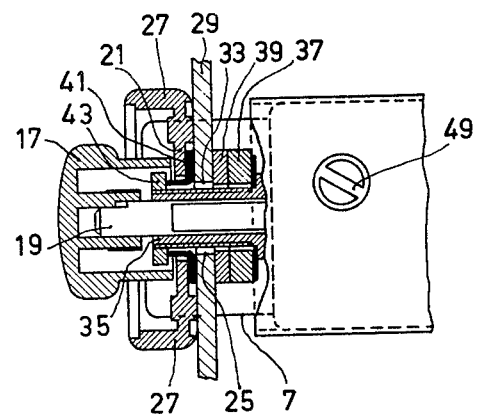

The invention will now be described in detail with reference to the accompanying drawings, in which:

FIG. 1 is a front view of an electrical apparatus in accordance with the invention which is intended for building in and which can be simply adapted for mounting on or against a wall, FIG. 2 is a plan view of a build-in apparatus as shown in FIG. 1, FIG. 3 is a sectional view, taken along the line III—III of FIG. 1, of the apparatus in the built-in condition, FIG. 4 is a sectional view, taken along the line IV—IV of FIG. 1, of the apparatus in the built-in condition.

Figure 5:
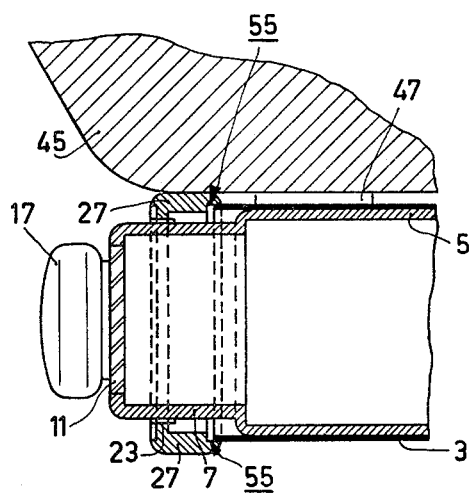
Figure 6:
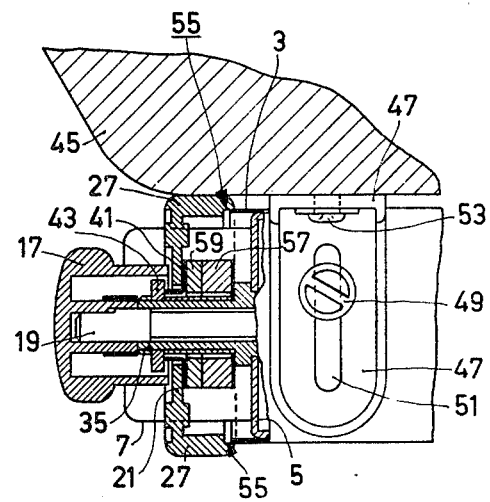

FIG. 5 is a sectional view, taken along the line V—V of FIG. 1, of the apparatus mounted on and underneath a wall, and FIG. 6 is a sectional view, taken along the line VI—VI of FIG. 1, of the apparatus mounted on and underneath a wall.

The electrical apparatus 1 shown in FIGS. 1 and 2 is intended for building in and comprises a rectangular metal cabinet 3 which is open at the front and which accommodates an electrical device 5. In the present case, the electrical device 5 is a car radio. For the sake of simplicity, the cabinet 3 is denoted by a solid line in FIG. 2 and the electrical device 5 by a broken line. The wall thicknesses of the cabinet 3 and the device are shown in FIG. 3. The device 5 includes a rectangular, box-shaped member 7 which projects beyond the circumference of the cabinet 3 (see FIG. 2) and which accommodates a known scale indicator mechanism 9 (see FIG. 1). A rectangular scale plate 11 (cover plate) is mounted in the front of the box-shaped member 7. The device 5 has a control member 13 for switching on the power supply voltage and a control member 15 for tuning. The control members 13 and 15 each include a rotatable control knob 17 and a rotatable control shaft 19 (FIG. 4) which project outside the box-shaped member 7. The front of the apparatus 1 is closed by the scale or cover plate 11 and a rectangular front plate 21 which is provided with a rectangular opening 23 wherethrough the box-shaped member 7 projects. The dimensions of the opening 23 substantially correspond to the dimensions of the box-shaped member 7. The front plate 21 is also provided with two openings 25 for the passage of the control members 13 and 15 (see FIG. 4). The front plate 21 includes interconnecting, upright walls 27 which extend transversely of the plane of the front plate and whose height is less than the distance over which the box-shaped member 7 projects beyond the circumference of the cabinet 3.

The apparatus shown in FIGS. 1 to 4 is built into a wall 29. To this end, the wall 29 is provided with a rectangular opening 31 for the passage of the box-shaped member 7 and two round openings 33 for the passage of the control members 13 and 15 (see FIGS. 3 and 4). Therefore, the space behind the wall 29 must be accessible for the cabinet 3 with the projecting box-shaped member 7 and the projecting control members 13 and 15 whose control knobs 17 have been removed before the introduction of the cabinet 3 behind the wall 29. Behind the wall 29 there may be provided supports for the cabinet 3. On each of the control shafts 19 there is provided a threaded bush 35 of a length such that it projects beyond the wall 29. The length of the threaded bush 35 is chosen so that for all thicknesses of the wall 29 occurring in practice an adequate length of the threaded bush 35 projects beyond the wall 29 to enable the front plate 21 to be secured. In the present case, the thickness of the wall 29 is such that the space between the wall 29 and the device 5 must be filled with spacer rings 37 and 39. After insertion of the cabinet 3 with the box-shaped member 7 and the control shafts 19 and the threaded bushes 35 through the openings 31 and 33 of the wall 29, the front plate 21 is slid over the box-shaped member 7 and the threaded bushes 35. Between the front plate 21 and the wall 29 there is provided a pressure ring 41 at the area of each threaded bush 35. The front plate 21 and the electrical device 5 are simultaneously secured to the wall 29 by means of two nuts 43 which are screwed onto the threaded bushes 35 (see FIG. 4). Subsequently, the control knobs 17 are fitted on the control shafts 19. The front plate 21 is mounted so that its upright edge walls 27 are directed forward to prevent given light reflections, thus improving the readability of the scale 11. The walls 27 are essential if the same front plate is to be used arbitrarily for building in or for mounting on or against a wall. The mounting of the apparatus 1 on and underneath a wall (without building in) will now be described with reference to FIGS. 1, 5 and 6. Parts in FIGS. 5 and 6 which are identical to parts in the other Figs. are denoted by corresponding reference numerals.

For mounting on and underneath a wall 45, the apparatus 1 is secured by means for two L-shaped suspension brackets 47. This is realised by means of screws 49 inserted through slotted holes 51 in the legs of the L-shaped brackets. Each bracket 47 is secured to the wall 45 by means of a screw 53. Before connection of the apparatus 1 to the wall 45, the front plate 21 is slid over the box-shaped member 7 and the threaded bushes 35, its upright walls 27, however, being directed rearwardly. The upright walls 27 connect with the circumferential edge of the cabinet 3 and are provided with a shoulder 55 for this purpose. The unit formed by the front plate 21 and the cabinet 3 is thus closed on all sides and represents an aesthetic construction. The front plate 21 is screwed over the edge of the cabinet 3 by means of the two nuts 43 (only one nut is visible in FIG. 6). Using two spacer rings 57 and 59, the space behind the front plate 21 is filled up. The pressure ring 41 is again used in this case. However, this ring is situated partly behind the front plate 21, as is clearly shown in FIG. 6. The depth of the shoulder 55 is larger than the sum of the thickness tolerances of the pressure ring 41 and the spacer rings 57 and 59 in order to ensure that the apparatus is closed on the sides as well as at the top and the bottom.

In the case of building in as well as in the case of mounting on or against a wall, the pressure rings project slightly beyond the front plate 21, so that a small clearance remains between the tightened nuts 43 and the front plate 21. This clearance is necessary to compensate for dimensional fluctuations due to temperature changes.

Even through the invention has been described on the basis of a car radio, it can also be used, for example, for cassette recorders, mobile radios and a variety of control apparatus. The control members may be push-buttons as well as rotatable members. The cover plate may be an ornamental plate or an indication plate. If use is made of a variety of apparatuses which are arranged near to each other, the front plate may comprise a plurality of windows so that a plurality of apparatuses have one common front plate. The invention is not restricted to geometrically rectangular apparatus, cabinets and box-shaped members. Slightly rounded apparatus, cabinets and box-shaped members which give the impression of being rectangular are considered to be within the scope of the present invention.

What is claimed is:

1. Electrical apparatus suitable either for building into a wall or for mounting against a wall, which comprises a substantially rectangular cabinet open on one side, an electrical device comprising a car radio accommodated in the cabinet, said electrical device having one or more control members and a substantially rectangular open box-shaped member both projecting outwardly through said open one side beyond the circumference of the cabinet, a cover plate closing the open box-shaped member, a front plate having one or more first openings for passage therethrough of said one or more control members and a second opening for passage therethrough of said box-shaped member, and an endless upright wall extending transversely from the front plate adjacent the periphery of the same, the height of said upright wall being less than the distance the box-shaped member projects beyond the circumference of the cabinet, the circumferential dimensions of said upright wall corresponding to the circumferential dimensions of the cabinet whereby, for mounting against a wall, the upright wall contacts the cabinet and said front plate closes the remainder of said open one side, and whereby, for building into a wall, the front plate is inverted whereby, the upright wall is directed outwardly to prevent light reflections.

* * * * *